United States Patent [19]

Fischer et al.

[11] Patent Number: 4,933,398

[45] Date of Patent: Jun. 12, 1990

[54] PHOTOSENSITIVE EPOXY RESINS AND USE THEREOF

[75] Inventors: Walter Fischer, Reinach, Switzerland; Jürgen Finter, Freiburg, Fed. Rep. of Germany

[73] Assignee: Ciba-Geigy Corporation, New York, N.Y.

[21] Appl. No.: 208,523

[22] Filed: Jun. 20, 1988

[30] Foreign Application Priority Data

Jul. 1, 1987 [CH] Switzerland ............... 2485/87

[51] Int. Cl.$^5$ ............................... C08G 59/56
[52] U.S. Cl. .................... 525/504; 430/280; 430/915; 522/48; 522/904; 522/28; 522/170; 528/112; 528/115; 528/220
[58] Field of Search ............ 528/112, 115, 220; 522/48, 904, 28, 170; 430/280, 915; 525/504

[56] References Cited

U.S. PATENT DOCUMENTS

| | | | |
|---|---|---|---|
| 3,344,117 | 9/1967 | Bamford et al. | 528/112 |
| 4,267,306 | 5/1981 | Davis et al. | 528/220 X |
| 4,510,279 | 4/1985 | Kishimura et al. | |
| 4,607,069 | 8/1986 | Tesch et al. | 528/220 X |
| 4,657,842 | 4/1987 | Finter et al. | |

FOREIGN PATENT DOCUMENTS 55-89245 7/1980 Japan .

*Primary Examiner*—Earl Nielsen

*Attorney, Agent, or Firm*—Stephen V. O'Brien

[57] ABSTRACT

A curable composition comprising (a) an epoxy resin, (b) a hardener if necessary, (c) an anthraquinone of formula I

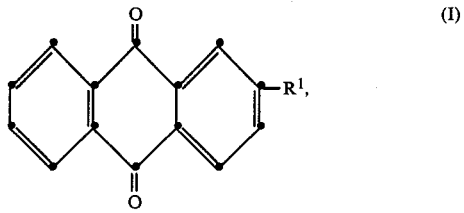

wherein $R^1$ is —COOH or a radical of formula II

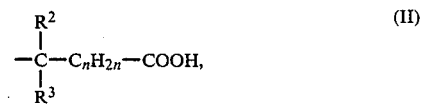

wherein n is 0 or a number from 1 to 12, $R^2$ is H, $C_1$-$C_{12}$-alkyl or —CN and $R^3$ is H, —CN or the radical —$C_mH_{2m}$X, where m is 0 or a number from 1 to 12 and X is —COOH or —CN, and (d) an amino alcohol. The cured compositions are photosensitive and are suitable for the preparation of metallic coatings and images by electroless metal deposition.

12 Claims, No Drawings

PHOTOSENSITIVE EPOXY RESINS AND USE THEREOF

The present invention relates to a curable composition comprising (a) an epoxy resin, (b) a hardener if necessary, (c) an anthraquinonecarboxylic acid and (d) an amino alcohol, to the use of the photosensitive cured composition for the preparation of metallic coatings and images by electroless metal deposition, and to aliphatic dicarboxylic acids substituted by anthraquino-2-yl.

European patent application A-0 112 798 proposes photosensitive crosslinked reaction products based on epoxy resins. With the concomitant use of metal salts of groups Ib or VIII of the periodic table of the elements, metal nuclei can be produced by exposure to light and these can be increased by electroless metal deposition. It is desirable to produce metallic coatings or images, by electroless metal deposition, direct on photosensitive epoxy resins without the concomitant use of metal salts.

The invention relates to a curable composition comprising (a) at least one epoxy resin with an average of more than one epoxy group in the molecule,
(b) an epoxy resin hardener if necessary,
(c) at least one anthraquinone of formula I

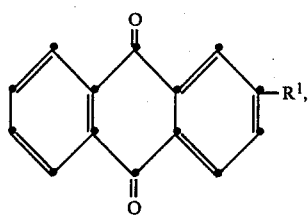

(I)

wherein $R^1$ is —COOH or a radical of formula II

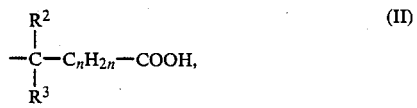

(II)

wherein n is 0 or a number from 1 to 12, $R^2$ is H, $C_1$–$C_{12}$-alkyl or —CN and $R^3$ is H, —CN or the radical —$C_mH_{2m}X$, where m is 0 or a number from 1 to 12 and X is —COOH or —CN, and (d) at least one primary or secondary aliphatic amine containing at least one hydroxyl group in the aliphatic radical.

$R^2$ as alkyl can be linear or branched alkyl preferably containing 1 to 6 C atoms, examples being methyl, ethyl, n- and i-propyl, n-, i-and t-butyl, pentyl, hexyl, 2-ethylhexyl, heptyl, octyl, decyl and dodecyl.

The $C_mH_{2m}$ and $C_nH_{2n}$ groups can be linear or branched alkylene. When $m > 0$ and $n > 0$, the alkylene groups are preferably identical. m and n are especially 0 or a number from 1 to 6. Examples of alkylene are, in particular, methylene and ethylene as well as 1,2- or 1,3-propylene, 1,2-, 1,3- or 1,4-butylene, 1,2-, 1,3-, 1,4- or 1,5-pentylene, 1,2-, 1,3-, 1,4-, 1,5- or 1,6-hexylene, 2-ethyl-1,6-hexylene, heptylene, nonylene, decylene, undecylene and dodecylene.

A preferred embodiment of the invention is a composition wherein, in formula I, $R^1$ is —COOH or a radical of formula II in which $R^2$ is H, $C_1$–$C_6$-alkyl or —CN, $R^3$ is H or the radical —$C_mH_{2m}X$, X is —COOH and m and n independently of one another are 0 or a number from 1 to 6. In particular, in this composition, m and n independently of one another are 0 or a number from 1 to 4.

An especially preferred embodiment of the invention is a composition wherein $R^1$ is —COOH or a radical of formula II in which $R^2$ is H, methyl, ethyl or —CN, $R^3$ is H or the radical —$C_mH_{2m}$COOH and m and n independently of one another are 0, 1, 2 or 3.

The anthraquinones of formula I are known in some cases or can be prepared by processes known per se. Carboxylic acids substituted by anthraquino-2-yl can be prepared by reacting alkenecarboxylic acid esters or alkenenitriles with anthracene in the presence of Lewis acids, then oxidizing the product to the anthraquinone (e.g. with Jones reagent) and finally hydrolyzing the anthraquinone.

Japanese patent disclosure Sho No. 55-89245 proposes the reaction of a 2-halogenoanthraquinone, halogen preferably being F, Cl or Br, with dialkyl malonates which may or may not be monoalkylated, in the presence of strong bases. Hydrolysis of the (anthraquino-2-yl)malonic acid diesters and subsequent decarboxylation leads to (anthraquino-2-yl)acetic acid or, as the case may be, (anthraquino-2-yl)-2-alkylacetic acids.

It has been found especially advantageous to carry out the reaction of 2-halogenoanthraquinones with dialkyl malonates in the presence of potassium carbonate as the base. The reaction can also be carried out with alkyl cyanoacetates or malonitrile. The carboxylic acid ester groups can be hydrolyzed selectively to carboxylic acid groups, the nitrile groups being retained, or hydrolyzed completely to carboxylic acid groups. Decarboxylation can be effected with or after hydrolysis. The carboxylic acids prepared in this way can be used in the composition of the invention.

The esters and nitriles which can be prepared in this way can also be used as intermediates and other (anthraquino-2-yl)alkylcarboxylic acids or (anthraquino-2-yl)alkyldicarboxylic acids to be used according to the invention can be prepared.

For this purpose, (anthraquino-2-yl)acetonitrile, (anthraquino-2-yl)malonitrile, (anthraquino-2-yl)cyanoacetic acid esters or (anthraquino-2-yl)malonic acid diesters can be reacted with a corresponding halogenoalkane, halogenoalkanenitrile or halogenoalkanecarboxylic acid ester in the presence of a base, e.g. potassium carbonate. The esters can then be hydrolyzed selectively to carboxylic acids, the nitrile groups being retained, or hydrolyzed completely with the nitrile groups to carboxylic acids. Decarboxylation can be effected with or after hydrolysis.

The reaction of 2-halogenoanthraquinones with malonic acid esters or with nitriles is advantageously carried out at temperatures from 20 to 200 and preferably 20° to 150° C. Solvents which can be used are e.g. sulfones or N-alkylated acid amides. Examples are dimethyl sulfoxide, tetramethylenesulfone, dimethylformamide, dimethylacetamide and N-methylpyrrolidone.

It is advisable to carry out selective hydrolysis in alcoholic solution in the presence of alkali metal hydroxides, e.g. KOH or NaOH. Complete hydrolysis, including the nitrile groups, is performed in aqueous-alkaline or aqueous-acidic solution. Decarboxylation is conventionally carried out at elevated temperatures, e.g. 100°–200° C.

The invention further relates to anthraquinones of formula Ia

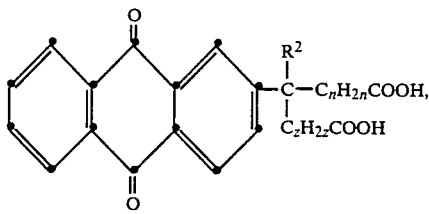

wherein $R^2$ is H or —CN, n is 0 or a number from 1 to 12, and z is a number from 1 to 12, and to a process for the preparation thereof, wherein (a) when n is 0, an (anthraquino-2-yl)malonic acid ester of formula IV

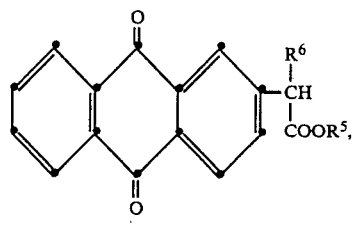

wherein $R^5O$— is the radical of a monohydric alcohol and $R^6$ is —CN or —COOR$^5$, is reacted in the presence of a base with a halogenocarboxylic acid ester of the formula $Y—C_zH_{2z}—COOR^5$, wherein Y is Cl or Br, after which the ester group is hydrolyzed in order to prepare compounds of formula Ia where $R^2$ is —CN, or the ester group and the nitrile group are hydrolyzed in order to prepare compounds of formula Ia where $R^2$ is H, and the reaction product is decarboxylated, or (b) when n>0, (anthraquino-2-yl)acetonitrile is reacted in the presence of a base with 2 mol of $Y—C_zH_{2z}—COOR^5$ or 1 mol of $Y—C_zH_{2z}—COOR^5$ and 1 mol of $Y—C_nH_{2n}—COOR^5$, the following procedure being the same as indicated under a).

$R^5$ is preferably $C_1-C_4$-alkyl and especially ethyl or methyl. In the compounds of formula Ia, the groups $C_nH_{2n}$ are preferably linear. n is preferably 0 or a number from 1 to 6 and z is preferably a number from 1 to 6. In particular, n is 0, 1, 2 or 3 and z is 1, 2 or 3. The dicarboxylic acids of formula I impart a high photosensitivity to the cured compositions of the invention even though the dicarboxylic acids are incorporated in the polymer network.

The anthraquinones of formulae I and Ia are suitable for the preparation of cured photosensitive epoxy resins.

The epoxy resin preferably contains an average of at least 2 epoxy groups in the molecule.

Possible epoxy resins are, in particular, those with an average of more than one glycidyl group, β-methylglycidyl group or 2,3-epoxycyclopentyl group bonded to a heteroatom (e.g. sulfur, preferably oxygen or nitrogen); these are, in particular, bis(2,3-epoxycyclopentyl) ether; diglycidyl or polyglycidyl ethers of polyhydric aliphatic alcohols such as butane-1,4-diol, or polyalkylene glycols such as polypropylene glycols; diglycidyl or polyglycidyl ethers of cycloaliphatic polyols such as 2,2-bis(4-hydroxycyclohexyl)propane; diglycidyl or polyglycidyl ethers of polyhydric phenols such as resorcinol, bis(p-hydroxyphenyl)methane, 2,2-bis(p-hydroxyphenyl)propane (=diomethane), 2,2-bis(4'-hydroxy-3',5'-dibromophenyl)propane and 1,1,2,2-tetrakis(p-hydroxyphenyl)ethane, or of condensation products of phenols with formaldehyde which are obtained under acid conditions, such as phenol novolaks and cresol novolaks; di(β-methylglycidyl) or poly(β-methylglycidyl) ethers of the above-mentioned polyhydric alcohols or polyhydric phenols; polyglycidyl esters of polybasic carboxylic acids such as phthalic acid, terephthalic acid, Δ$^4$-tetrahydrophthalic acid and hexahydrophthalic acid; N-glycidyl derivatives of amines, amides and heterocyclic nitrogen bases, such as N,N-diglycidylaniline, N,N-diglycidyltoluidine, N,N,O-triglycidyl-p-aminophenol and N,N,N',N'-tetraglycidyl-bis(p-aminophenyl)methane; triglycidyl isocyanurate; N,N'-diglycidylethyleneurea; N,N'-diglycidyl-5,5-dimethylhydantoin, N,N'-diglycidyl-5-isopropylhydantoin, N,N-methylene-bis(N',N'-diglycidyl)-5,5-dimethylhydantoin and 1,3-bis(N-glycidyl-5,5-dimethylhydantoin)-2-glycidyloxypropane; and N,N'-diglycidyl-5,5-dimethyl-6-isopropyl-5,6-dihydrouracil.

Glycidylated novolaks, hydantoins, aminophenols, bisphenols or aromatic diamines are a preferred group of epoxy resins. Especially preferred compositions contain, as epoxy resin, a glycidylated cresol novolak, bisphenol A diglycidyl ether, a bisphenol A diglycidyl ether "advanced" with bisphenol A, hydantoin N,N'-bisglycide, 2-hydroxypropylene-1,3-bishydantoin triglycide, p-aminophenol triglycide, diaminodiphenylmethane tetraglycide or mixtures thereof.

Prereacted adducts of such epoxides with epoxy hardeners are also suitable, e.g. the above-mentioned adduct of bisphenol A diglycidyl ether and bisphenol A.

Possible epoxy resin hardeners are acidic or basic compounds. Examples of suitable hardeners are: amines such as aliphatic, cycloaliphatic or aromatic, preferably primary and/or secondary amines, e.g. ethylenediamine, hexamethylenediamine, trimethylhexamethylenediamine, diethylenetriamine, triethylenetetramine, tetraethylenepentamine, N,N-dimethylpropylene-1,3-diamine, N,N-diethylpropylene-1,3-diamine, 2,2-bis(4'-aminocyclohexyl)propane, 3,5,5-trimethyl-3-(aminomethyl)cyclohexylamine ("isophoronediamine"), m-phenylenediamine, p-phenylenediamine, bis(4-aminophenyl)methane, bis(4-aminophenyl) sulfone and m-xylylenediamine; adducts of acrylonitrile or monoepoxides, e.g. ethylene oxide or propylene oxide, and polyalkylenepolyamines, e.g. diethylenetriamine or triethylenetetramine; adducts of an excess of polyamines, e.g. diethylenetriamine or triethylenetetramine, and polyepoxides, e.g. diomethane polyglycidyl ethers; adducts of monophenols or polyphenols and polyamides; polyamides, in particular those derived from aliphatic polyamines, e.g. diethylenetriamine or triethylenetetramine, and dimerized or trimerized unsaturated fatty acids, e.g. dimerized linoleic acid (VERSAMID ®); polysulfides (THIOKOL ®); aniline-formaldehydes; polyhydric phenols, e.g. resorcinol, 2,2-bis(4-hydroxyphenyl)propane or phenol-formaldehyde resins; polybasic carboxylic acids and their anhydrides, e.g. phthalic anhydride, Δ$^4$-tetrahydrophthalic anhydride, hexahydrophthalic anhydride, 4-methylhexahydrophthalic anhydride, 3,6-endomethylene-Δ$^4$-tetrahydrophthalic anhydride, 4-methyl-3,6-endomethylene-Δ$^4$-tetrahydrophthalic anhydride (=methylnadic anhydride), 3,4,5,6,7-hexachloro-3,6-endomethylene-Δ$^4$-tetrahydrophthalic anhydride, succinic anhydride, adipic anhydride, trimethyladipic anhydride, azelaic anhydride, sebacic anhydride, maleic anhydride and dodecylsuccinic anhydride; and pyromellitic dianhydride, trimellitic anhydride, benzophenonetetracarboxylic anhydride or mixtures of such anhydrides.

Novolaks, polyaminoamides and carboxylic acid anhydrides are a preferred group of hardeners. The composition of the invention can also contain curing accelerators and/or epoxy resin polymerization catalysts or thermal and/or photochemical curing catalysts. Examples are: tertiary amines or quaternary ammonium compounds, e.g. Mannich bases such as 2,4,6-tris(dimethylaminomethyl)phenol, benzyldimethylamine, 2-ethyl-4-methylimidazole and triamylammonium phenate; monophenols or polyphenols such as phenol, diomethane or salicylic acid; dicyandiamide; boron trifluoride and its complexes with organic compounds, such as $BF_3$-ether complexes and $BF_3$-amine complexes, e.g. $BF_3$-monoethylamine complex and acetoacetanilide-$BF_3$ complex; phosphoric acid; and triphenyl phosphite. Tertiary amines and imidazoles are preferred. Suitable photosensitive curing accelerators are onium salts or metal complex salts, e.g. diazonium salts of aromatic amines, triphenylsulfonium or diphenyliodonium salts or cyclopentadienyl-iron-arene salts.

Curing accelerators and catalysts are conventionally added in an amount of 0.1–10% by weight, based on the epoxy resin. Epoxy resin hardeners are generally used in equimolar amounts, based on the epoxy groups and functional groups of a hardener.

The composition preferably contains the anthraquinone of formula I in an amount of 0.1–1%, especially 0.2–0.8, mol/kg of epoxy resin, and the amine containing hydroxyl groups in an amount of 0.1–1.2, especially 0.3–1, mol/kg of epoxy resin. Additional hardeners are preferably present in an amount of 0.1–0.5, especially 0.1–0.3, mol/kg of epoxy resin.

If the anthraquinone of formula I is a monocarboxylic acid, it is advantageous to use an epoxy resin with an average of at least 3 epoxy groups in the molecule. The amines of component (d) can be aliphatic amines containing hydroxyl groups, having 2 to 30, preferably 2 to 20, C atoms and having 1 to 3, preferably 1, hydroxyl group in the aliphatic radical. The aliphatic radical can be linear or branched and interrupted by —O— or amino groups. The aliphatic radical preferably contains primary OH groups. In a preferred embodiment of the invention, the amine has the formula III

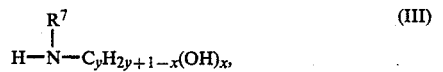
(III)

wherein $R^7$ is H, linear or branched $C_1$–$C_{18}$-alkyl, $C_3$–$C_7$-cycloalkyl, $C_6$–$C_{10}$-aryl, $C_7$–$C_{18}$-alkaryl, $C_7$–$C_{12}$-aralkyl, $C_8$–$C_{18}$-alkaralkyl or the group —$C_yH_{2y+1-x}OH_x$, x is a number from 1 to 3 and y is a number from 2 to 12, it being possible for the group $C_yH_{2y}$ to be interrupted by one or more —O— or —$NR^7$—.

$R^7$ as alkyl preferably contains 1 to 12 and especially 1 to 6 C atoms. $R^7$ as alkyl is preferably methyl or ethyl. $R^7$ is H in particular. $R^7$ as cycloalkyl preferably contains 5 or 6 ring C atoms and is e.g. cyclopentyl or cyclohexyl.

$R^7$ as aryl may be naphthyl and especially phenyl. $R^7$ as alkaryl is especially $C_7$–$C_{18}$-alkylphenyl, for example methylphenyl, ethylphenyl, dimethylphenyl, n- and i-propylphenyl, n-, i- and t-butylphenyl, pentylphenyl, hexylphenyl, octylphenyl, nonylphenyl, decylphenyl and dodecylphenyl. $R^7$ as aralkyl can be 1- or 2-phenyleth-1-yl or especially benzyl. $R^7$ as alkaralkyl is preferably alkylbenzyl having, in particular, 8 to 14 C atoms, e.g. methylbenzyl, ethylbenzyl, dimethylbenzyl, n- and i-propylbenzyl, n-, i- and t-butylbenzyl, pentylbenzyl and hexylbenzyl. If the group $C_yH_{2y}$ is interrupted by —O—, it can be an oxaalkylene radical which can have e.g. the formula —$R^8$—$(OR^9)_t$—, wherein $R^8$ and $R^9$ independently of one another are linear or branched $C_2$–$C_6$-alkylene and t is a number from 2 to 6. If the group $C_yH_{2y}$ is interrupted by —$NR^7$—, it preferably has the formula $R^{10}$—$NH_sR^{11}$—, wherein $R^{10}$ is linear or branched $C_2$–$C_6$-alkylene, preferably ethylene, $R^{11}$ is linear or branched $C_1$–$C_{10}$-alkylene, preferably $C_2$–$C_6$-alkylene, and s is a number from 1 to 3. In formula III, y is especially a number from 2 to 7.

Those amines of formula III in which $R^7$ is H, y is a number from 2 to 7 and x is a number from 1 to 3 are a preferred subgroup.

Examples of amines of formula III are: ethanolamine, 1-amino-2-hydroxypropane, 1-amino-3-hydroxypropane, 1-amino-4-hydroxybutane, 1-amino-5-hydroxypentane, 1-amino-6-hydroxyhexane, aminotrimethylolmethane, aminodimethylolmethane, aminomethyldimethylolmethane, aminomethyltrimethylolmethane, hydroxyethoxyethylamine, hydroxypropoxyethylamine, N-(hydroxyethyl)ethylenediamine, N-(hydroxyethyl)diethylenetriamine and $H_2N(CH_2CH_2O)_{\overline{2-6}}H$.

Primary aliphatic amines containing hydroxyl groups are epoxy resin hardeners, linear polymers being obtained when epoxy resins having 2 epoxy groups in the molecule are used. The concomitant use of other hardeners gives crosslinked polymers.

When using the monofunctional anthraquinones of formula I, it is advantageous to use epoxy resins having at least 3 epoxy groups in the molecule, e.g. epoxidized novolaks, in order to obtain cross-linked epoxy resins.

The compositions of the invention are curable, the cured or cross-linked epoxy resins being photosensitive. Thin layers of metals such as copper can be deposited by electroless metal deposition on those parts of the surface which have been exposed to light.

The composition is cured in known manner, it being possible for curing to be preceded or accompanied by moulding in accordance with the conventional moulding processes, examples being the preparation of coatings on a base material by spraying, painting or knife coating, the preparation of mouldings by means of casting techniques or the preparation of composites by means of dip-coating and compression processes.

In a preferred embodiment of the invention, the amine of component (d), containing hydroxyl groups, can be prereacted with the epoxy resin of component (a) to give adducts, which can then be mixed and crosslinked with an anthraquinone of formula I acting as a hardener, if necessary together with epoxy resin hardeners. Suitable hardeners for anthraquinones of formula I are, in particular, the dicarboxylic acids of formula I.

When using monocarboxylic acids of formula I, the concomitant use of an epoxy resin hardener, especially a novolak, amine or anhydride hardener, may be advantageous. It is advisable to prereact the monofunctional anthraquinone together with the amine containing —OH and with the epoxide and then to mix the reaction product with a hardener and cure the mixture.

In addition to stepwise curing, it is also possible to mix all the components and then cure the mixture.

The components are mixed by conventional processing methods, together with a solvent if necessary. It is possible to introduce other additives conventionally used for processing or improving the properties of the cured epoxy resins, e.g. plasticizers, dyes, pigments, fillers, mould release agents or H donors. For metal deposition, metal salts or metal complexes of groups Ib or VIII of the periodic table of the elements may advantageously be present, e.g. in an amount of 0.01 to 10% by weight, based on the composition. Curing is generally carried out at temperatures from 20° to 200° C. and especially 50° to 150° C. The invention further relates to the cured compositions.

The cured compositions are photosensitive. The parts exposed to light appear darker than the unexposed parts. Metals can be deposited direct on the exposed parts with conventional metal deposition baths (see e.g. U.S. Pat. No. 4 510 279), especially those containing e.g. nickel or copper salts. Printed circuits, for example, can be prepared in this way. The exposed epoxy resins can also be used for optical storage.

The invention further relates to the use of a cured composition of the invention for the preparation of metallic coatings or images by electroless metal deposition after complete or partial exposure of the surface.

Exposure is preferably effected with UV light. Any desired light sources can be employed, the use of UV lamps being preferred. Examples of suitable light sources are xenon lamps, metal halide lamps and especially high-pressure and medium-pressure mercury vapour lamps.

A possible procedure for preparing the metallic coatings or images is to cure the composition of the invention, which, according to the invention, may be in the form of a layer on a base material, then to expose it over the surface or through a master and finally to treat it with a metal deposition bath.

The concomitant use of a metal salt or metal complex is superfluous. The deposited metals adhere firmly to the surface of the epoxy resin; no pretreatment is necessary. Furthermore the cured compositions have high glass transition temperatures.

The following Examples illustrate the invention in greater detail.

(A) PREPARATION EXAMPLES

Example 1: (Anthraquino-2-yl)succinic acid (a) Diethyl (anthraquino-2-yl)malonate 48.53 g (200 mmol) of 2-chloroanthraquinone, 160.17 g (1 mol) of diethyl malonate and 500 ml of dimethyl sulfoxide (DMSO) are heated at 120° C. until everything has dissolved. The solution is then cooled to 110° C. and 165.85 g (1.2 mol) of potassium carbonate are added in portions. After stirring for 1 day at 110° C., the mixture is cooled, treated with HCl solution and extracted three times with toluene. The extracts are washed three times with water, dried over sodium sulfate and evaporated. Filtration with toluene over silica gel and recrystallization from methylene chloride/pentane yields 38.53 g (53%) of pure product with a melting point of 114°–117° C.

| Elemental analysis (% by weight) | | | |
|---|---|---|---|
| Calculated: | C 68.85 | H 4.95 | O 26.20% |
| Found: | C 68.77 | H 5.14 | O 25.89% |

(b) Diethyl 2-(anthraquino-2'-yl)-2-carboethoxysuccinate 20.0 g (54.6 mmol) of compound 1a are stirred with 22.63 g (164 mmol) of potassium carbonate, 18.23 g (109.2 mmol) of ethyl bromoacetate and 200 ml of DMSO for 1 hour at 25° C. The mixture is treated with toluene and dilute HCl solution. Extraction of the aqueous phase twice with toluene, washing of the toluene phases with water, drying over sodium sulfate and evaporation yields a crystalline residue which, after stirring with diethyl ether, filtration and drying, gives 19.77 g (80%) of pure product with a melting point of 80°–84° C.

| Elemental analysis (% by weight) | | | |
|---|---|---|---|
| Calculated: | C 66.36 | H 5.35 | O 28.29% |
| Found: | C 66.65 | H 5.40 | O 28.54% |

(c) (Anthraquino-2-yl)succinic acid 16.35 g (292 mmol) of potassium hydroxide are dissolved in 400 ml of absolute ethanol and 22.0 g (48.6 mmol) of compound 1b are added. The mixture is stirred for 20 minutes at 25° C. and then heated to the reflux temperature over a period of 30 minutes. After cooling, it is treated with 2 N aqueous HCl solution and extracted with THF/toluene (1:1). The organic phases are dried over sodium sulfate and evaporated. Stirring with diethyl ether, filtration and drying yields 15.51 g (98%) of pure product with a melting point of 245°–250° C. (decomposition).

| Elemental analysis (% by weight) | | | |
|---|---|---|---|
| Calculated: | C 66.67 | H 3.73 | O 29.60% |
| Found: | C 66.98 | H 4.02 | O 28.83% |

Example 2: (Anthraquino-2-yl)succinic acid (a) Dimethyl (anthraquino-2-yl)malonate 12.14 g (50 mmol) of 2-chloroanthraquinone, 33.03 g (250 mmol) of dimethyl malonate and 125 ml of DMSO are stirred at 110° C. After 14 hours at 110° C., the mixture is evaporated on a rotary evaporator at 95° C./17 mbar. The residue is taken up in methylene chloride/ dilute HCl solution and the organic phases are dried over sodium sulfate and evaporated. Filtration on silica gel (eluent: 3% of acetone in CH$_2$Cl$_2$) and recrystallization from CH$_2$Cl$_2$/pentane gives 13.99 g (82%) of product with a melting point of 149°–153° C.

| Elemental analysis (% by weight) | | |
|---|---|---|
| Calculated: | C 67.46 | H 4.17% |
| Found: | C 67.62 | H 4.20% |

(b) 1-Methyl 4-ethyl 2-(anthraquino-2'-yl)-2-carbomethoxysuccinate 1.01 g (3 mmol) of dimethyl (anthraquino-2-yl)malonate, 668 mg (4 mmol) of ethyl bromoacetate, 533 mg (4 mmol) of potassium carbonate and 6 ml of DMSO are stirred for 90 minutes at 25° C. Working-up of the mixture analogously to Example 1b yields 1.21 g (95%) of product which, when recrystallized from methylene chloride/pentane, has a melting point of 148°–151° C.

| Elemental analysis (% by weight) | | |
|---|---|---|
| Calculated: | C 65.09 | H 4.75% |

-continued

| Elemental analysis (% by weight) | | |
|---|---|---|
| Found: | C 64.59 | H 4.66% |

(c) (Anthraquino-2-yl)succinic acid

Hydrolysis analogous to Example 1c [424 mg (1 mmol) of compound 2b, 337 mg (6 mmol) of KOH and 10 ml of absolute ethanol] gives, after 4 hours at 25° C. and 1 hour under reflux, 320 mg (98%) of pure product with a melting point of 240°–250° C.

Example 3: 3-(Anthraquino-2'-yl)-3-cyanoglutaric acid (a) Ethyl (anthraquino-2-yl)cyanoacetate 50.0 g (206 mmol) of 2-chloroanthraquinone, 69.92 g (618 mmol) of ethyl cyanoacetate and 500 ml of DMSO are heated to 120° C., whereupon a solution is formed. At 110° C., 170.86 g (1236 mmol) of potassium carbonate are then added in portions. After stirring for 2 hours, the product is isolated by filtration and washed with $H_2O$. The crystals are dissolved in $CH_2Cl_2$ and the organic phase is washed with water, dried over sodium sulfate and concentrated. Recrystallization from $CH_2Cl_2$/pentane yields 60.0 g (91%) of product with a melting point of 167°–170° C.

| Elemental analysis (% by weight) | | | | |
|---|---|---|---|---|
| Calculated: | C 71.47 | H 4.11 | N 4.39 | O 20.04% |
| Found: | C 70.93 | H 4.39 | N 4.17 | O 20.06% |

(b) (Anthraquino-2-yl)acetonitrile 50 g of compound a are heated with 500 ml of DMSO and 50 ml of $H_2O$ for 1 hour at 130° C. The mixture is cooled and discharged into 2 l of ice water. The precipitate is isolated by filtration, washed with water and dried at 150° C. under vacuum. Stirring in diethyl ether yields 34.3 g (89%) of (anthraquino-2-yl)acetonitrile with a melting point of 212°–215° C.

| Elemental analysis (% by weight) | | | |
|---|---|---|---|
| Calculated: | C 77.72 | H 3.67 | N 5.66% |
| Found: | C 77.40 | H 3.76 | N 5.73% |

(c) Diethyl 3-(anthraquino-2'-yl)-3-cyanoglutarate 10 g (40.44 mmol) of compound 3b, 20.26 g (121.33 mmol) of ethyl bromoacetate, 16.8 g (121.33 mmol) of potassium carbonate and 100 ml of DMSO are stirred for 90 minutes at 25° C. The mixture is taken up in dilute HCl solution/toluene and the toluene phase is washed with water, dried over sodium sulfate and evaporated. Recrystallization from $CH_2Cl_2$/pentane yields 12.77 g (75%) of pure product with a melting point of 125°–126° C.

| Elemental analysis (% by weight) | | | | |
|---|---|---|---|---|
| Calculated: | C 68.73 | H 5.05 | N 3.34 | O 22.89% |
| Found: | C 68.59 | H 5.16 | N 3.43 | O 22.86% |

(d) 3-(Anthraquino-2'-yl)-3-cyanoglutaric acid 12 g (28.61 mmol) of compound 3c, 9.63 g (171.66 mmol) of potassium hydroxide and 120 ml of ethanol are stirred for 2½ hours at 25° C. The mixture is concentrated on a rotary evaporator under vacuum and the residue is taken up in 2 N HCl solution/THF/toluene. The organic phase is separated off, dried over sodium sulfate and concentrated. Stirring with diethyl ether yields 10.2 g (98%) of pure product with a melting point of 166°–171° C. (decomposition).

| Elemental analysis (% by weight) | | | |
|---|---|---|---|
| Calculated: | C 66.12 | H 3.61 | N 3.86% |
| Found: | C 66.20 | H 3.68 | N 3.90% |

Example 4: 4-(Anthraquino-2'-yl)-4-cyanopimelic acid (a) Diethyl 4-(anthraquino-2'-yl)-4-cyanopimelate 2.63 g (10.6 mmol) of (anthraquino-2-yl)acetonitrile, 5.78 g (31.9 mmol) of ethyl 3-bromopropionate, 4.41 g (31.9 mmol) of potassium carbonate and 26 ml of DMSO are stirred for 6 days at 25° C. The mixture is taken up in toluene and the organic phase is washed three times with water and once each with dilute HCl solution, $NaHCO_3$ solution and saturated NaCl solution, dried over sodium sulfate and evaporated. Chromatography on silica gel (2% of acetone in $CH_2Cl_2$) yields 1.02 g (22%) of liquid product.

| Elemental analysis (% by weight) | | | |
|---|---|---|---|
| Calculated: | C 69.78 | H 5.63 | N 3.13% |
| Found: | C 69.61 | H 5.61 | N 3.21% |

(b) 4-(Anthraquino-2'-yl)-4-cyanopimelic acid 820 mg (1.83 mmol) of compound 4a are stirred in a solution of 257 mg (4.58 mmol) of potassium hydroxide in 8 ml of ethanol, initially for 6 hours at 25° C. and then for 30 minutes under reflux. The mixture is concentrated under vacuum, the residue is taken up in water, the suspension is filtered and the mother liquor is acidified. Extraction with 1:1 THF/toluene, washing of the organic phases with saturated NaCl solution, drying over sodium sulfate, evaporation and recrystallization from THF/toluene yields 610 mg (85%) of product with a melting point of 233°–239° C.

| Elemental analysis (% by weight) | | | |
|---|---|---|---|
| Calculated: | C 67.52 | H 4.38 | N 3.58% |
| Found: | C 67.24 | H 4.57 | N 3.24% |

(B) APPLICATION EXAMPLES

Examples 5–10

6.04 g (27 meq of epoxy groups) of a glycidylated cresol novolak with an epoxy equivalent of 233.71 g/mol and 2.27 g (9 mmol) of anthraquinone-2-carboxylic acid are heated to 120° C. in 20 ml of ethylene glycol monoethyl ether with 40 ml of benzyldimethylamine under inert gas, with stirring. After cooling to room temperature, 0.676 g (9 mmol) of propan-2-olamine is added to this solution, with stirring, affording a viscous solution which is stored in a refrigerator.

The viscous solution is cast as a film on an aluminium or polyester base by the wire-coating technique and dried in a forced-air oven for 12 hours at 80° C.

An analogous procedure was followed in Examples 6 to 10. Table 1 shows the properties of the polyadducts.

The efficiency of photoreduction is determined in the following manner. A film on a polyester base of O.D. = 1 at 324 nm is irradiated with a high-pressure Hg vapour lamp at 40 mW/cm$^{-2}$ and the UV/VIS spectrum is run at regular intervals. The band at 324 nm decreases and the band at 385 nm increases. The ratio of the two bands after an exposure time of 2 minutes is taken as the efficiency.

Photometallization

Films on a polyester base are exposed on a thermostatically controllable vacuum heating stage at 50° C. through a negative with a high-pressure Hg vapour lamp at an intensity of 40 mW/cm$^{-2}$. This affords a dark negative image of the master, which is intensified at 45° C. in a deposition bath of the following composition (see U.S. Pat. No. 4510276):

| | |
|---|---|
| CuSO$_4$.5H$_2$O | 0.0665 mol/l |
| HCHO | 0.0467 mol/l |
| Quadrol | 0.0599 mol/l |
| NaOH | pH 12.6 |
| NaCN | 25 mg/l |
| 2-mercaptobenzthiazole | 10 mg/l |
| to give a metallic copper image. | |

EXAMPLES 11–12

173.3 g (0.5 mol) of bisphenol A diglycidyl ether are dissolved in 180 ml of ethylene glycol monoethyl ether at 40° C. 15.3 g (0.25 mol) of ethanolamine are added dropwise to this solution, with stirring, the temperature is raised to 60° C. and the mixture is allowed to react for a further 3 hours, affording a viscous solution which is stored in a refrigerator. The epoxy equivalent of the solution is 1.158 mol of epoxide/kg (determined by the method of R. R. Jay, Analytical Chemistry 36 (1964) 667); this corresponds to an average molecular weight of the "advancement" product of 915 Daltons (theoretically 754 Daltons).

5 g of the solution (5.79 milliequivalents of epoxide) were reacted at 130° C. for 8 hours, under inert gas, with 2.85 mmol of difunctional anthraquinone and 20 mg of dimethylbenzylamine as catalyst, with stirring. The result is a viscous solution with a low residual epoxide content. The solution is cast as a film on aluminium or a polyester base by the wire-coating technique and dried in a forced-air oven for 12 hours at 80° C. An analogous procedure is followed in Examples 11 and 12. Table 2 shows the properties of the polyadducts and the efficiency of photoreduction.

TABLE 1

| Example | Carboxylic acid n | Carboxylic acid mmol | Glycidylated novolak mmol | Propan-2-olamine mmol | Tg °C. | UV efficiency O.D.$_{385\,nm}$ / O.D.$_{324\,nm}$ |
|---|---|---|---|---|---|---|
| 5 | 0 | 3 | 9 | 3 | 116 | 0.40 |
| 6 | 0 | 2 | 9 | 3.5 | 117 | 0.51 |
| 7 | 0 | 1 | 9 | 4 | 121 | 0.53 |
| 8 | 1 | 3 | 9 | 3 | 87 | 0.39 |
| 9 | 2 | 2 | 9 | 3.5 | 104 | 0.57 |
| 10 | 3 | 1 | 9 | 4 | 117 | 0.69 |

Carboxylic acid:

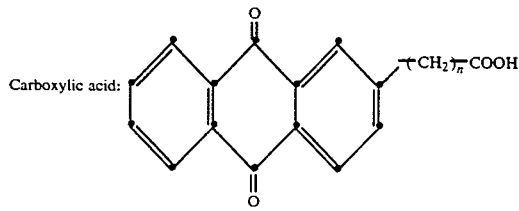

TABLE 2

| Example no. | Anthraquinone derivative weight (mmol) | Hydroxyalkyl- amine weight (mmol) | Epoxide weight (mmol) | Content of functional groups in the polymer in mol/kg | | Tg (°C.) | O.D.$_{385\,nm}$ / O.D.$_{324\,nm}$ |
|---|---|---|---|---|---|---|---|
| 11 | [structure] 1 mmol | H$_2$NCH$_2$CH$_2$OH 1 mmol | bisphenol A diglycidyl ether 3 mmol | anthraquinone (AQ) 0.79 mol AQ/kg | hydroxyl 3.98 mol OH/kg | 59 | 0.51 |

TABLE 2-continued

| Example no. | Anthraquinone derivative weight (mmol) | Hydroxyalkylamine weight (mmol) | Epoxide weight (mmol) | Content of functional groups in the polymer in mol/kg | Tg (°C.) | O.D.$_{385\ nm}$ / O.D.$_{324\ nm}$ |
|---|---|---|---|---|---|---|
| 12 | 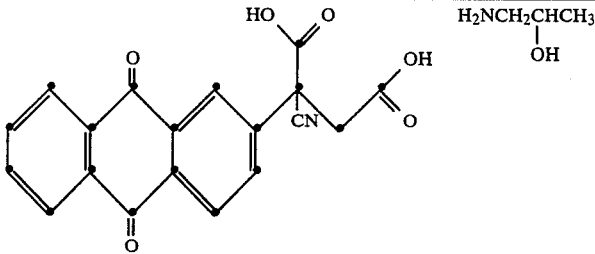 1 mmol | H$_2$NCH$_2$CHCH$_3$<br>         OH<br>2 mmol | 3 mmol | 0.18 mol AQ/kg   3.44 mol OH/kg | 97 | 0.76 |

EXAMPLES 13-24

Examples 13-24 in Table 3 show the effect of crosslinking and of the molar content of anthraquinoyl groups in the network. Linear polyadducts obtained from (anthraquino-2-yl)succinic acid, bisphenol A diglycidyl ether and hydroxyethylamine are crosslinked with a novolak (Examples 13-18) or a carboxylic acid dianhydride. The samples are prepared analogously to the method described here for Example 13:

0.649 g (2 mmol) of (anthraquino-2-yl)succinic acid, 8.177 g (23.6 mmol) of bisphenol A diglycidyl ether and 1.175 g (19.2 mmol) of hydroxyethylamine are stirred in 10 g of diethylene glycol dimethyl ether for 4 hours at 120° C. The mixture is allowed to cool to room temperature and 0.552 g of a cresol novolak with a hydroxy equivalent weight of 123.15 g/mol of hydroxide, dissolved in 0.5 g of dioxane, is then added. The solution is cast as a film on aluminium or a polyester base by the wire-coating technique, dried in a forced-air oven for 12 hours at 80° C. and then cured for 3 hours at 150° C. Table 3 shows the properties of the polyadducts.

EXAMPLES 25-28

Table 4 shows the effects of the content of —OH groups and the type of hydroxyalkylamine groups on the photoreduction of the anthraquinoyl group. Analogously to Example 11, polyadducts are prepared with propanolamine, hexanolamine and trihydroxymethylaminomethane, with a varying content of hydroxyalkylamine, and bisphenol A diglycidyl ether.

Photometallization

Films of the epoxy resins according to Examples 11-28 on a polyester base are exposed on a thermostatically controllable vacuum heating stage at 50° C. through a negative with a high-pressure Hg vapour lamp at an intensity of 40 mW/cm$^{-2}$. This affords a dark negative image of the master, which is intensified in the manner described in Example 5 to give a metallic copper image.

TABLE 3

| Example no. | Weight AQ-succinic acid (mmol) | Ethanolamine (mmol) | Bisphenol A diglycidyl ether | Hardener (milliequivalents) | Content in the polymer (mmol/kg) of AQ | OH | Tg °C. | O.D.$_{385\ nm}$ / O.D.$_{324\ nm}$ |
|---|---|---|---|---|---|---|---|---|
| 13 | 2  | 19.2 | 23.6  | 4.5 | 0.2 | 4.28 | 81.2 | 0.91 |
| 14 | 4  | 16.0 | 22.3  | 4.2 | 0.4 | 3.83 | 83   | 0.77 |
| 15 | 6  | 12.9 | 21    | 4.0 | 0.6 | 3.38 | 82   | 0.60 |
| 16 | 8  | 9.7  | 19.7  | 3.7 | 0.8 | 2.94 | 79   | 0.41 |
| 17 | 10 | 6.5  | 18.4  | 3.5 | 1.0 | 2.49 | 83   | 0.32 |
| 18 | 12 | 3.34 | 17.03 | 3.2 | 1.2 | 2.04 | 79   | 0.31 |
| 19 | 2  | 19.2 | 23.6  | 4.5 | 0.2 |      | 59   | 0.93 |
| 20 | 4  | 16.0 | 22.3  | 4.2 | 0.4 |      | 78   | 0.78 |
| 21 | 6  | 12.9 | 21    | 4.0 | 0.6 |      | 76   | 0.62 |
| 22 | 8  | 9.7  | 19.7  | 3.7 | 0.8 |      | 77   | 0.44 |
| 23 | 10 | 6.5  | 18.4  | 3.5 | 1.0 |      | 73   | 0.32 |
| 24 | 12 | 3.3  | 17.0  | 3.2 | 1.2 |      | 78   | 0.24 |

AQ = (anthraquino-2-yl)

TABLE 4

| Example no. | Hydroxyalkylamine | Weight AQ-succinic acid (mmol) | Epoxide (mmol) | Hydroxyalkylamine (mmol) | Novolak hardener (milliequivalents) | Content in the polymer of AQ (mol/kg) | OH (mol/kg) | Tg °C. | O.D.$_{385\ nm}$ / O.D.$_{324\ nm}$ |
|---|---|---|---|---|---|---|---|---|---|
| 25 | H$_2$NCH$_2$CH$_2$OH | 3.33 | 30 | 16.7 | 20   | 0.21 | 6.32 | 98  | 0.58 |
| 26 | H$_2$NC(CH$_2$OH)$_3$ | 3.33 | 30 | 16.7 | 20   | 0.21 | 6.98 | 102 | 0.73 |
| 27 | H$_2$N(CH$_2$)$_4$—OH | 3.33 | 30 | 16.7 | 20   | 0.22 | 5.09 | 79  | 0.77 |
| 28 | H$_2$N(CH$_2$)$_6$—OH | 3.33 | 30 | 10   | 16.7 | 0.20 | 4.22 | 81  | 0.77 |

EXAMPLES 29-44

The procedure is the same as in Examples 5-10. The compositions and properties are collated in Table 5.

TABLE 5

| Example | Anthraquinone-carboxylic acid (3 mmol) | 5,5'-Dimethyl-hydantoin N,N'-diglycidyl ether (mmol) | Propan-2-olamine (mmol) | Novolak (milli-equivalents) | Epoxy compound (mmol) | Tg (°C.) | $\dfrac{O.D._{385\,nm}}{O.D._{324\,nm}}$ |
|---|---|---|---|---|---|---|---|
| 29 | anthraquinone-2-carboxylic acid | 2 | 6 | 0 | A (7) | 98 | 0.25 |
| 30 | anthraquinone-2-carboxylic acid | 4 | 6 | 0 | A (5) | 68 | 0.26 |
| 31 | anthraquinone-2-carboxylic acid | 7 | 6 | 0 | A (2) | 55 | 0.4 |
| 32 | anthraquinone-2-carboxylic acid | 6 | 3 | 1 | A (1) | 80 | 0.46 |
| 33 | anthraquinone-2-carboxylic acid | 7 | 6 | 0 | B (2) | 67 | 0.5 |
| 34 | (anthraquino-2-yl)-succinic acid | 6 | 3 | 1 | B (1) | 76 | 0.6 |
| 35 | (anthraquino-2-yl)-succinic acid | 6 | 3 | 1 | A (1) | 79 | 0.48 |
| 36 | (anthraquino-2-yl)-succinic acid | 5 | 3 | 1 | C (2) | 69 | 0.61 |
| 37 | (anthraquino-2-yl)-succinic acid | 6 | 3 | 1 | C (1) | 72 | 0.62 |
| 38 | (anthraquino-2-yl)-succinic acid | 5 | 3 | 1 | D (2) | 76 | 0.45 |
| 39 | (anthraquino-2-yl)-succinic acid | 6 | 3 | 1 | D (1) | 76 | 0.46 |
| 40 | (anthraquino-2-yl)-succinic acid | 6.5 | 3 | 1 | E (0.5) | 75 | 0.49 |
| 41 | (anthraquino-2-yl)-succinic acid | 5 | 3 | 1 | F (2) | 71 | 0.45 |
| 42 | (anthraquino-2-yl)-succinic acid | 2 | 3 | 1 | F (5) | 73 | 0.44 |
| 43 | (anthraquino-2-yl)-succinic acid | 4 | 3 | 1 | F (3) | 78 | 0.56 |
| 44 | (anthraquino-2-yl)-succinic acid | 3 | 3 | 1 | F (4) | 77 | 0.55 |

A = glycidylated cresol novolak (epoxy equivalent: 223.71 g/mol)
B = glycidylated cresol novolak (epoxy equivalent: 216.5 g/mol)
C = bisphenol A diglycidyl ether "advanced" with bisphenol A (epoxy equivalent: 421.9 g/mol)
D = as C, epoxy equivalent: 901 g/mol
E = as C, epoxy equivalent: 1695 g/mol
F = bisphenol A diglycidyl ether

What is claimed is:

1. A curable composition comprising
   (a) at least one epoxy resin with an average of more than one epoxy group in the molecule,
   (b) an optionally epoxy resin hardener,
   (c) at least one anthraquinone of formula I

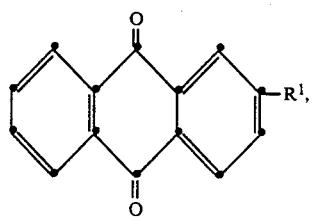

wherein $R^1$ is —COOH or a radical of formula II

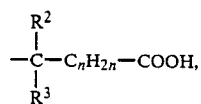

wherein n is 0 or a number from 1 to 12, $R^2$ is H, $C_1$-$C_{12}$-alkyl or —CN and $R^3$ is H, —CN or the radical —$C_mH_{2m}X$, where m is 0 or a number from 1 to 12 and X is —COOH or —CN, and
   (d) at least one primary aliphatic amine containing at least one hydroxyl group in the aliphatic radical.

2. A composition according to claim 1, which contains
   (a) the anthraquinone of formula I in an amount of 0.1–1 mol/kg of epoxy resin, and
   (b) the amine in an amount of 0.1 to 1.2 mol/kg of epoxy resin.

3. A composition according to claim 1, which contains glycidylated novolaks, hydantoins, aminophenols, bisphenols or aromatic diamines as epoxy resins.

4. A composition according to claim 3, wherein the epoxy resin is a glycidylated cresol novolak, bisphenol A diglycidyl ether, bisphenol A diglycidyl ether "advanced" with bisphenol A, 5,5-dimethylhydantoin N,N'-bisglycide, 1,3-bis(N',N'-diglycidyl-5,5-dimethyl-hydanto-4-yl)-2-glycidoxypropane, p-aminophenol triglycide, diaminophenylmethane tetraglycide or mixtures thereof.

5. A composition according to claim 1, wherein the hardener (b) is a novolak, a polyaminoamide or a polycarboxylic acid anhydride.

6. A composition according to claim 1, wherein the anthraquinone of formula I is a monocarboxylic acid and the epoxy resin (a) contains an average of at least 3 epoxy groups.

7. A composition according to claim 1, wherein, in formula I, $R^1$ is —COOH or a radical of formula II in which $R^2$ is H, $C_1$-$C_6$-alkyl or —CN, $R^3$ is H or the radical —$C_mH_{2m}X$, X is —COOH and m and n independently of one another are 0 or a number from 1 to 6.

8. A composition according to claim 7, wherein m and n independently of one another are 0 or a number from 1 to 4.

9. A composition according to claim 7, wherein $R^1$ is —COOH or a radical of formula II in which $R^2$ is H, methyl, ethyl or —CN, $R^3$ is H or the radical —$C_mH_{2\text{-}m}$COOH and m and n are independently 0, 1, 2 or 3.

10. A composition according to claim 1, wherein the amine of component (d) has the formula III

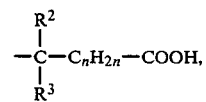

wherein $R^7$ is H, x is a number from 1 to 3 and y is a number from 2 to 12, it being possible for the group $C_yH_{2y}$ to be interrupted by one or more —O— or —$NR^7$—.

11. A composition according to claim 10, wherein, in formula III, y is a number from 2 to 7 and x is a number from 1 to 3.

12. A cured composition consisting of
(a) at least one epoxy resin with an average of more than one epoxy group in the molecule,
(b) optionally an epoxy resin hardener,
(c) at least one anthraquinone of formula I

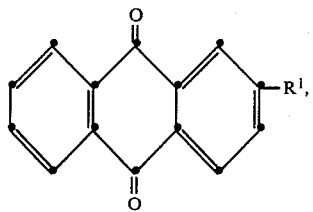

wherein $R^1$ is —COOH or a radical of formula II

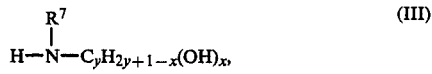

wherein n is 0 or a number from 1 to 12, $R^2$ is H, $C_1$-$C_{12}$-alkyl or —CN and $R^3$ is H, —CN or the radical —$C_mH_{2m}$X, where m is 0 or a number from 1 to 12 and X is —COOH or —CN, and
(d) at least one primary aliphatic amine containing at least one hydroxyl group in the aliphatic radical.

* * * * *